(12) United States Patent
Narahara et al.

(10) Patent No.: US 6,190,834 B1
(45) Date of Patent: Feb. 20, 2001

(54) PHOTOSENSITIVE RESIN COMPOSITION, AND MULTILAYER PRINTED CIRCUIT BOARD USING THE SAME

(75) Inventors: Masatoshi Narahara; Mineo Kawamoto; Tokihito Suwa; Masao Suzuki; Satoru Amou, all of Hitachi; Akio Takahashi, Hitachioota; Hiroyuki Fukai, Shimodate; Mitsuo Yokota, Yuuki; Shiro Kobayashi, Isehara; Masashi Miyazaki, Hadano, all of (JP)

(73) Assignees: Hitachi, Ltd.; Hitachi Chemical Company, Ltd., both of Tokyo (JP)

( * ) Notice: Under 35 U.S.C. 154(b), the term of this patent shall be extended for 0 days.

(21) Appl. No.: 09/073,645

(22) Filed: May 6, 1998

(30) Foreign Application Priority Data

May 15, 1997 (JP) .................................................. 9-125674
Jun. 5, 1997 (JP) .................................................. 9-148051

(51) Int. Cl.[7] .......................... G03C 1/73; C08F 283/00; C08F 2/46
(52) U.S. Cl. .................................. 430/284.1; 430/280.1; 522/92; 522/905; 522/90; 522/94; 522/95; 522/31; 525/528; 525/530; 525/526
(58) Field of Search .............................. 430/280.1, 284.1; 525/528, 530, 526; 522/92, 905, 90, 94, 95, 31

(56) References Cited

U.S. PATENT DOCUMENTS 3,644,289 * 2/1972 Sayigh et al. ............................ 525/59
4,412,048 * 10/1983 Dixon et al. ............................ 428/414

(List continued on next page.)

*Primary Examiner*—Janet Baxter
*Assistant Examiner*—Sin J. Lee
(74) *Attorney, Agent, or Firm*—Antonelli, Terry, Stout & Kraus, LLP

(57) ABSTRACT

The present invention provides a photosensitive resin composition capable of forming an insulating film, which is superior in both a roughening property and an adhesiveness, and a via-hole, which is highly reliable in connection, and a multilayer printed circuit board.

The present invention provides a photosensitive resin composition containing a first resin, which is an epoxy resin, and a second resin having a N-substituted carbamic acid ester atomic group and a radical polymeric unsaturated bond in its side chain. The second resin is desirably an oligomer having a repeating unit expressed by the following general formula (chem. 1) or (chem. 3) by 3–10 units. Where, X is H or $CH_3$, Y and Z is H or an alkyl group of carbon number 1–4, n is 0 or 1, a part of $R^1$ is an atomic group expressed by the following general formula (chem. 2), the residual $R^1$ is a hydroxyl group, and $R^2$ is an alkylene group of carbon number 1–4.

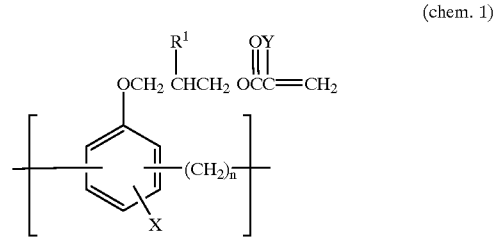

(chem. 1)

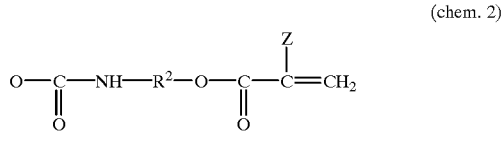

(chem. 2)

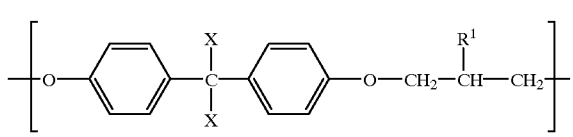

(chem. 3)

19 Claims, 3 Drawing Sheets

U.S. PATENT DOCUMENTS

| | | | |
|---|---|---|---|
| 4,444,806 | * | 4/1984 | Morgan et al. .................... 427/516 |
| 4,767,643 | * | 8/1988 | Westervelt et al. ................ 427/512 |
| 4,902,727 | * | 2/1990 | Aoki et al. ........................ 522/90 |
| 4,943,516 | * | 7/1990 | Kamayachi et al. ............. 430/280.1 |
| 5,428,083 | * | 6/1995 | Smith et al. ...................... 523/414 |
| 5,965,269 | * | 10/1999 | Inada et al. ..................... 428/413 |

* cited by examiner

PHOTOSENSITIVE RESIN COMPOSITION, AND MULTILAYER PRINTED CIRCUIT BOARD USING THE SAME

BACKGROUND OF THE INVENTION

The present invention relates to a photosensitive resin composition, which is suitable for forming photo-via-holes when a multilayer circuit board is formed by a build up system, to an insulating film obtainable by curing the above composition, and to the multilayer circuit board provided with the above insulating film.

Currently, printed circuit boards are significantly improved with the aim of reducing size and weight of electronic devices. Particularly, in order to respond to a high density mounting demand such as bare chips, CSP (chip size package), and BGA (ball grid array), manufacturing methods of the multilayer circuit board by build up system using lithography, wherein interlayer connection is performed by via-holes having high freedom, are widely used. And, high performance a photosensitive resin composition usable in these methods have been required.

In accordance with high density surface mounting, particularly, such as BGA and bare chip mounting which currently come to receive wide attention, the multilayer circuit board itself, i.e. a base material for the mounting, is exposed to a high temperature in the mounting processes such as a reflow process, a wire bonding process, and the like. Therefore, an insulating layer must be formed with a photosensitive resin having a high glass transition point (Tg) in order to prevent mounting members from deteriorating various characteristics such as an adhesive force and an elastic modulus under a high temperature in the mounting processes and repairing processes. As the photosensitive resin having a high glass transition point, resins containing epoxy resin as a main component, which are cured by cathion polymerization using a photo-acid generating agent, are disclosed. For instance, technology of photosensitive resin composition, of which main component is well known epoxy resin, has been disclosed in JP-B-49-17040 (1974). Technology using mainly epoxy resin and vinyl compounds have been disclosed in JP-A-54-48881 (1979), JP-A-56-55420 (1981), and JP-A-5-273753 (1993).

In accordance with manufacturing processes of the multilayer circuit board by build up system using lithography as indicated in FIG. 1, generally, a film of photosensitive material (a photosensitive resin composition) is formed onto surface of a core substrate 3, which has been provided with an inner layer conductor 1 at the surface (FIG. 1(*a*)); through-holes for forming via-holes reaching at the inner circuits in a lower layer through the photosensitive layer 2 are formed by exposing the photosensitive film 2 via a designated mask and developing (FIG. 1(*b*)); surface of the insulating layer (including inner wall of the through holes for forming the via-holes) is roughened by an oxidizing agent in order to ensure an adhesiveness with a circuit conductor (such as plated copper, and the like) which is subsequently formed (FIG. 1(*c*-1)); and after forming a plated resist film 6 having a designated pattern on the roughened surface, outer circuits 7 (flat circuit and via-holes circuit) are formed at the exposed portion of the roughened plane by plating (FIG. 1(*d*-1)).

However, a curing degree of the photosensitive resin composition differs depending on a depth from surface of the film at the exposure, because the exposure dose of ultraviolet rays differs depending on the depth by self absorption of the ultraviolet rays. Therefore, the curing degree differs significantly between the surface and the bottom of the film. Because the photosensitive resin composition has different ultraviolet ray absorption depending on the portions of the film, a significant difference in the curing degree of the upper portion and the bottom portion of the film is generated at the exposure. Accordingly, if the surface roughening operation is performed after exposure and development of the film, the progress of roughening at the bottom portion of the through holes for via-hole formation becomes larger than that of the upper portion of the film. Therefore, practically, problems such as peeling the insulating film, and expanding the inner diameter at the bottom portion 5 of the through hole for via-hole formation 4 (i.e forming a reverse tapered shape) as indicated in FIG. 1(*c*-2) and (*d*-2) are generated. The reverse tapered shape portion 5 of the through hole for via-hole formation is not desirable, because it may cause a break of via-hole circuit, a crack generation in the insulating layer, and others.

In order to prevent the above problems, and to roughen the inner wall of the through hole for via-hole formation uniformly, progressing the curing of the insulating layer before the roughening process by adding a sensitizer to the photosensitive resin composition, increasing the exposure dose, heat treating after the development, and the like can be considered. However, if doing so, the surface portion of the insulating film is cured excessively, and sufficient adhesion with the flat circuit conductor can not be obtained, because the surface is not roughened desirably in the roughening process.

Accordingly, in accordance with the prior art, roughening and adhesiveness of the insulating film could not be compatible each other. The above problem is significant with the insulating film, of which film thickness is equal to or more than 40 μm, particularly, in accordance with the prior art, a via-hole of more than 25 μm in diameter could not be formed in an insulating film of more than 45 μm thick.

SUMMARY OF THE INVENTION

One of the objects of the present invention is to provide; a photosensitive resin composition, which can form an insulating film having a preferable property in both roughening and adhesiveness, and a via-hole having a high connection-reliability; an insulating film formed of the photosensitive resin composition; and a multilayer circuit board provided with the insulating film.

In order to achieve the above object of the present invention, a photosensitive resin composition including a first resin of epoxy resin, and a second resin containing a N-substituted carbamic acid ester atomic group and a radical polymeric unsaturated bond in a side chain of a main component is disclosed in the present invention.

In accordance with the photosensitive resin composition of the present invention, the inner wall of the through hole for via-hole formation can be cured uniformly even if the ultraviolet dose is reduced depending on the hole depth, and curing the surface excessively can be prevented, by using a combination of epoxy resin which can be cross-linked by a cathion polymerization, and the second resin having a N-substituted carbamic acid ester atomic group and a radical polymeric unsaturated bond in a side chain, which can be cross-linked by a radical polymerization. Accordingly, in accordance with the photosensitive resin composition of the present invention, an insulating film having preferable properties in roughening and adhesiveness can be obtained. And the photosensitive resin composition of the present invention is particularly suitable as a photosensitive material for forming insulating film of multilayer circuit board, because a through hole, which is not in a reverse tapered shape, can be formed in the insulating film.

Furthermore, in accordance with the present invention, an insulating film obtainable by curing the above photosensitive resin composition, and a multilayer circuit board provided with the above insulating film as an interlayer insulating layer are provided. In accordance with using the photosensitive resin composition of the present invention, a via-hole having a high connection-reliability can be formed in an insulating film even if the insulating film is formed with a large film thickness. In accordance with the present invention, a multilayer circuit board provided with; an interlayer insulating film, of which thickness is equal to or larger than 30 μm, desirably equal to or larger than 45 μm, more desirably in the range of 50–100 μm, and preferably in the range of 50–60 μm; a circuit formed on the surface of the interlayer insulating film; and a via-hole through the interlayer insulating film for interlayer connection, of which inner diameter is equal to or larger than 25 μm, and preferably in the range of 40–100 μm, and is desirably in a ratio of approximately 1:1 to the thickness of the interlayer insulating film; is provided.

The ratio by weight of the first resin and the second resin is desirably in the range of 0.8:1–5:1, and preferably in the range of 1:1–3:1. If the second resin is less, forming the via-hole in a reverse tapered shape can not be prevented sufficiently. If the second resin is excessive, the cathion polymerization is hindered, and resolution can be decreased.

The first resin of the present invention is desirably epoxy resin having an epoxy equivalent of 100–500 g/equivalent. Although epoxy resin used as the first resin in the present invention does not have any particular restriction, bifunctional epoxy resin having an epoxy equivalent of 100–300 g/equivalent, multifunctional epoxy resin more than trifunctional having an epoxy equivalent of 160–500 g/equivalent, and their mixture can be usable. For making it flame retardant, halogenized epoxy resin (desirably bromided) can be used concurrently.

The bifunctional epoxy resin contributes to flattening the film when photosensitive resin varnish is applied onto the inner layer circuit by decreasing the varnish viscosity of the photosensitive resin composition, and gives the resin composition material (insulating film) after curing the photosensitive film an adhesiveness with the inner circuit, in addition to prevent the photosensitive film after drying from generating cracks by giving the film flexibility.

In accordance with the present invention, the bifunctional epoxy resin usable as the first resin are; for example, various bisphenol A epoxy resin, bisphenol F epoxy resin, aliphatic epoxy resin, alicyclic epoxy resin, and the like. For instance, epoxy resin such as Epikote 801, 802, 807, 815, 819, 825, 827, 828, and 834 made by Yuka-shell Co., Nadecole EX-201, 212, and 821 made by Nagase Chemical Industries Co., and KRM 2110 and 2410 made by Asahi Denka Kogyo K.K. are commercially available. The bifunctional epoxy resin having an epoxy equivalent of at least 300 g/equivalent such as Epikote 1001, 1004, 1009, and the like made by Yuka-shell Co. are usable. However, if only bifunctional epoxy resin having an epoxy equivalent of at least 300 g/equivalent is used as the first resin, the glass transition point is too low in some cases. Therefore, the epoxy equivalent of the total first resin is desirably adjusted in the range of 100–300 g/equivalent by adding the previously described bifunctional epoxy resin having the low epoxy equivalent.

The epoxy resin of more than trifunctional has an effect to raise the glass transition temperature by increasing the cross-linking density of the resin composition material after curing. The epoxy resin of more than trifunctional usable for the first resin in the present invention are, for example, phenol-novolak type epoxy resin, orthocresol-novolak type epoxy resin, and the like. Commercially available epoxy resin of more than trifunctional are such as Epikote 180S65 and 1031S made by Yuka-shell Co., ESCN-195 and 220 made by Sumitomo Chemical Co., BREN-104, 105, EOCN-104S, EPPN-201, and 501 made by Nippon Kayaku Co., and KRM-2650 made by Asahi Denka Kogyo K.K., and the like.

As the second resin in the present invention, a resin containing a N-substituted carbamic acid ester atomic group and a radical polymeric unsaturated bond in a side chain is used. As the radical polymeric unsaturated bond, a vinyl ester atomic group is desirable. The resin having vinyl ester atomic group in the side chain are disclosed in Nihon Secchaku Gakkaishi (J. of Japanese Society of Adhesion) vol. 31, No. 8 p334 (1995).

The main chain skeleton of the second resin is not particularly restricted, and, the second resin can be selected arbitrary from any resin, only if the resin can form N-substituted carbamic acid ester atomic group (desirably having a hydroxyl group) in its side chain, depending on required film characteristics. However, in view of the glass transition point (Tg), multifunctional epoxy resin such as various bisphenol A epoxy resin, bisphenol F epoxy resin, aliphatic epoxy resin, alicyclic epoxy resin, phenol novolak type epoxy resin, orthocresol novolak type epoxy resin and the like, or halides of these resins such as bromides are desirable as the main chain. Particularly, the multifunctional epoxy resin added with acrylic acid or methacrylic acid is preferable, because a radical polymeric vinyl group is introduced into its side chain. Accordingly, epoxy acrylate resin or epoxy methacrylate resin, of which hydroxyl group is partly substituted with N-substituted carbamic acid ester atomic group, is particularly suitable for the second resin.

In order to introduce the N-substituted carbamic acid ester atomic group into the side chain of these main chain compounds, for instance, a main chain compound A having a hydroxyl group is used, and a compound B having an isocyanate group is added to a part of the hydroxyl group of the main chain compound A as indicated in FIG. 3.

As the compound having an isocyanate, acrylic isocyanate, or methacrylic isocyanate is preferably used, because a radically polymeric vinyl group can be introduced. Accordingly, as the second resin, either of isocyanate added epoxy acrylate resin, or isocyanurate added epoxymethacrylate resin is particularly preferable.

Practically, an oligomer expressed by the following general formula (chem. 1), or a halide of the oligomer, or an oligomer expressed by the following general formula (chem. 3), or a halide of the oligomer is desirably used as the second resin.

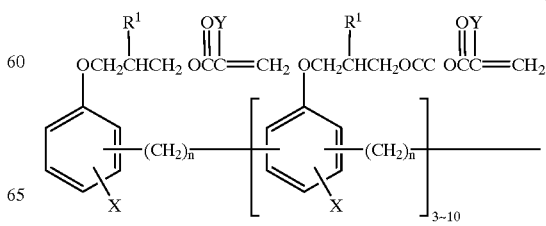

(chem. 1)

-continued

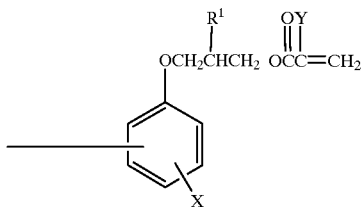

(where, X is hydrogen, or a methyl group, Y is hydrogen, or an alkyl group of carbon number 1–4, and n is zero or 1.)

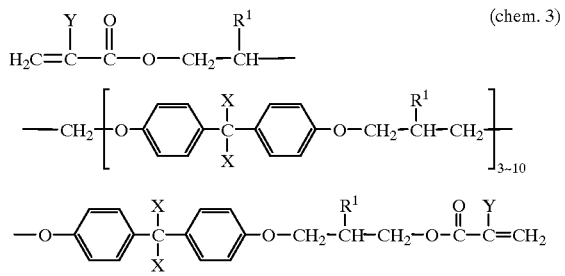

(chem. 3)

(where, X is hydrogen, or a methyl group, Y is hydrogen, or an alkyl group of carbon number 1–4. Two X connected to a carbon atom can be same or different each other.)

In either equations of chem. 1 and chem. 3, a part of $R^1$ contained in a molecule is a N-substituted carbamic acid ester atomic group expressed by the following general formula (chem. 2), and the residual $R^1$ is a hydroxyl group.

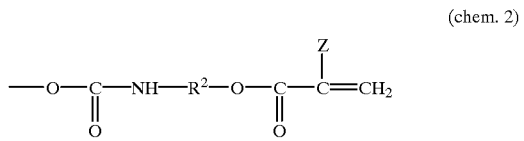

(chem. 2)

(where, $R^2$ is an alkylene group of carbon number 1–4, and Z is hydrogen, or an alkyl group of carbon number 1–4.)

A ratio of the N-substituted carbamic acid ester atomic group occupying the total number of $R^1$ in a molecule is desirably at least 0.5 mol % in order to obtain the sufficient effect, and preferably less than 20 mol % in order to maintain sufficient resolution. As the halide, for instance, an aromatic nucleus, of which at least one of hydrogen is substituted with a halogen atom, can be used.

The resin composition of the present invention further desirably contains a substance which generates acid and/or radicals by irradiation of light, that is, a photo-acid generating agent and/or a photo-radical polymerization initiator.

The photo-acid generating agent is a component, which generates an acid by irradiation of light, and contributes to curing the epoxy resin by a cathion polymerization, and its content is desirably in the range of 1–10 parts by weight to 100 parts of total weight of the first and the second resins. However, if the photo-acid generating agent exists more than 1 part by weight, a sufficient resolution can be obtained. If less than 10 parts by weight, a sufficient roughening can be maintained.

The photo-radical polymerization initiator is a component, which generates radical seeds by irradiation of light, and contributes to curing the resin having a radically polymerable vinyl group by a radical polymerization, and its content is desirably in the range of 0.1–5 parts by weight to 100 parts of total weight of the first and the second resins. However, if the initiator exists more than 0.1 part by weight, a sufficient effect to prevent forming the reverse tapered shape can be obtained. If less than 5 parts by weight, a sufficient resolution can be maintained.

The present invention can be performed without using the photo-radical polymerization initiator, if the photo-acid generating agent generates radicals by irradiation of light. However, in order to obtain a higher effect, the addition of the photo-radical polymerization initiator is desirable.

The photo-acid generating agents suitable for the present invention are sulfonium salts, iodonium salts, and the like, of which paired anions are $BF_4$, $PF_6$, $AsF_6$, and $SbF_6$.

Examples of the sulfonium salts are triphenyl sulfonium salt, dimethylphenyl sulfonium salt, diphenyl benzyl sulfonium salt, tritolylphenyl sulfonium salt, 4-butoxyphenyl diphenyl sulfonium salt, tris(4-phenoxyphenyl)sulfonium salt, 4-acetoxy-phenyl diphenyl sulfonium salt, tris(4-thiomethoxyphenyl)sulfonium salt, di(methoxynaphthyl) methyl sulfonium salt, dimethylnaphthyl sulfonium salt, phenylmethyl benxyl sulfonium salt, and the like. Examples of the iodonium salts are diphenyl iodonium salt, phenyl-2-thienyl iodonium salt, di(2,4-methoxyphenyl)iodonium salt, di(3-methoxycarbonylphenyl)iodonium salt, di(4-acetoamidophenyl)iodonium salt, (4-octyloxyphenyl)phenyl iodonium salt, and the like.

The photo-radical polymerization initiaters suitable for the present invention are; benzoin, carbonyl compounds represented by polynucleus quinoline group such as methylanthraquinone, 2-ethylanthraquinone, 2-t-butylanthraquinone, 1-chloroanthraquinone, 2-amylanthraquinone, and the like, azo compounds represented by azobisisobutyronitrile, and diazonium compounds, mercaptan group, organosulfur compounds represented by alkyl disulfide, alkyl metal group, metal carbonyl group, and other various compounds. Particularly, carbonyl compounds are preferable.

Among the radical polymerization initiator of carbonyl compounds, there are two types such as a hydrogen withdrawal type and a self cleavage type. The hydrogen withdrawal type compounds are; thioxanthone group such as thioxanthone, 2,4-diethylthioxanthone, 2-chlorothioxanthone, 2,4-dichlorothioxanthone, 2-methylthioxanthone, 2,4-diisopropylthioxanthone, and the like, and benzophenone group such as benzophenone, 4,4-bismethylaminobenzophenone, and the like. Although the above hydrogen withdrawal type initiator can be used, the radical polymerization initiator of the self cleavage type is suitable for the present invention.

The radical polymerization initiaters of the self cleavage type are; benzoin and its alkyl ether group such as benzoin, benzoin methyl ether, benzoin ethyl ether, benzoin isopropyl ether, benzoin isobutyl ether, benzyl methyl ketal, and the like, acetophenone group such as acetophenone, 2,2-dimethoxy-2-phenyl acetophenone, 2-hydroxy-2-methyl-1-phenyl-propane-1-on, diethoxy acetophenone, 2,2-diethoxy-2-phenylacetophenone, 1,1-dichloroacetophenone, 1-hydroxycyclohexyl phenylketone, and the like, and ketal group such as acetophenone dimethylketal, benzyldimethylketal, and the like.

In order to accelerate the curing velocity, a polymerization accelerator can be used. The polymerization accelerators are, for example, ethanol amine, tertiary amine such as N-methyl diethanol amine, benzoic acid derivatives such as 2-dimethylaminoethylbenzoic acid, 4-dimethylaminobenzoic acid ethyl ester, and the like. The amount of these amine group polymerization accelerator to be used is adjusted so as not to hinder the cathion polymerization.

The photosensitive resin composition of the present invention desirably contains further a third resin having a phenolic hydroxyl group. By adding the third resin, a solubility into an aqueous developing solution (particularly an aqueous alkaline solution) at the developing process is increased, and the glass transition point (Tg) of the resin composition material after curing can be elevated, because the third resin reacts with the epoxy resin during the curing time to increase the cross-linking density.

The resins having a phenolic hydroxyl group, which can be used as the third resin in the present invention, are, for example, novolak resin, resole resin, polyhydroxystyrene as a hydroxystyrene polymer, polyhydroxyphenylmaleimide as a hydroxyphenylmaleimide polymer, and the like. Particularly, various resole resins having both a phenolic hydroxyl group and a methylol group in a molecule are preferable. The resin having a self condensation type phenolic hydroxyl group such as resole resins causes a self condensation reaction with an acid catalyst, and has advantages to give a high cross-linking density at the curing, a cured film having a higher glass transition point, and to improve a plating solution resistance by reducing the amount of the residual phenolic hydroxyl in the cured film.

For the third resin, novolak resin, which is a condensation product a compound having a phenolic hydroxyl group and formaldehyde, is preferable. For the present invention, a condensation product of a compound having a phenolic hydroxyl group such as phenol, o-cresol, m-cresol. p-cresol, 2,4-xylenol, 2,5-xylenol, 3,4-xylenol, 3,5-xylenol, and their mixture with formalehyde is suitable, and, particularly, m, p-cresol novolak phenol is preferable.

When using the third resin, a content at least 5 parts by weight of the third resin to 100 parts of total weight of the first and the second resins is sufficient for keeping its advantages, and, if the content is less than 30 parts by weight, a desirable solubility to the developing solution can be maintained.

Furthermore, the photosensitive resin composition of the present invention desirably contains a rubber component. By adding the rubber component, the resin composition film after curing obtains flexibility to prevent the film from generating cracks, and increases its adhesiveness with the circuit conductors.

The rubber components usable for the present invention are, for instance, polybutadiene and its epoxy compounds, co-polymers of acrylonitrile-butadiene having a vinyl group, an amino group, or a carboxyl group at the terminal, co-polymers of these resins with epoxy resin, and the like. Particularly, denatured rubber with epoxy resin is preferable. These resins can be used singly or in combination of two kinds or more.

When using the rubber component, a content in the range of 5–40 parts by weight of the rubber component to 100 parts of total weight of the first and the second resins is desirable. An addition at least 5 parts by weight of the rubber component gives a preferable flexibility to the resin composition film after curing, and a desirable adhesiveness with the plated circuit. When the rubber component is added more than 40 parts by weight, the resolution is deteriorated, and the glass transition point of the resin composition film after curing is lowered.

Furthermore, the photosensitive resin composition of the present invention desirably contains fine particles of rubber. By dispersing the fine particles of rubber in the film, lowering the glass transition point of the cured film can be suppressed. The particle size of the fine particles of rubber is desirably smaller than the film thickness of the formed insulating film, and the diameter of the via-hole. For instance, XER 91P made by Japan Synthetic Rubber Co., YR-528 and YR-516, wherein the rubber particles are dispersed in epoxy resin, made by Tohto Kasei Co., and the like are suitable for the present invention. A content in the range of 5–20 parts by weight of the fine particles of rubber to 100 parts of total weight of the first, second, and third resins is desirable.

Furthermore, the photosensitive resin composition of the present invention can contain a radical hardening fourth resin. The radical hardening resin is a resin having a radical hardening unsaturated double bond, and it can be, for instance, a reactive monomer of styrene, acrylic acid, and methacrylic acid, multifunctional oligomers, and a raw material of the previously described second resin, that is, a resin having a vinyl ester atomic group in the side chain before introducing a N-substituted carbamic acid ester atomic group into the side chain. Particularly, a resin having a vinyl ester atomic group in the side chain, wherein a carboxylic acid anhydride is added to a hydroxyl group in the side chain, is desirable, because the solubility into the developing solution can be improved.

When using the fourth resin, a content in the range of 5–30 parts by weight of the fourth resin to 100 parts of total weight of the first, second, and third resins is desirable. The fourth resin can be polymerized by the previously described photoradical polymerization initiator.

Furthermore, in order to improve resin characteristics/film characteristics, the photosensitive resin composition of the present invention can contain adequately thermal curing agent, mold release agent, flame retardant, sensitizer, inorganic compound particles, leveling agent, and others. In accordance with using these agents, various properties of heat resistance, roughening, plating resistance, developing, tack-free, anti-crack, and others can be improved.

The thermal curing agent is a thermosetting catalyst for epoxy resin, and the residual epoxy resin after a photo curing reaction can be cured by heating. When the thermal curing agent is used, the cross-linking density of the resin composition material after the photo curing can be increased larger than that of the resin composition material which is cured only by a photo-acid generating agent by a heat treatment during and/or after the photo-curing, and the glass transition point can be elevated.

The thermal curing agent suitable for the present invention are, for instance, various thermosetting catalysts for epoxy resin such as triphenylphosphine, imidazole, and the like. Particularly, thermosensitive onium salt which generates an acid by heating is desirable. For instance, 2-butenyltetramethylenesulfonium hexafluoroantimonate (CP-66) made by Asahi Denka Kogyo K.K., and others are commercially available. When using the thermal curing agent, its kind and content can be adjusted depending on the characteristics, such as the glass transition point and elastic modulus, required for the resin composition film after curing.

When a compound selected from the triphenylphosphine group, or the imidazole group is used as the thermal curing agent, the content of the thermal curing agent is desirably equal to or less than 1 part by weight to 100 parts of the total weight of the previously described first to fourth resins, in order not to hinder the photo-curing reaction. When an onium salt is used, the content can be increased to more than 1 part by weight to 100 parts of the total weight of the previously described first to fourth resins, because the onium salt does not hinder the photo-curing reaction. However, in order to avoid making the resin composition film after curing brittle, the content is desirably restricted to less than 10 parts by weight.

The mold release agent is an agent to cover surface of the photosensitive film by seeping out to the surface of the photosensitive film during the process of drying and curing the photosensitive film. In accordance with covering the surface, the tack-free property of the photosensitive film can be improved, and developing property can be improved by suppressing impregnation of the developing solution into the exposed and cured portions. The mold release agents suitable for the present invention are, for instance, polysiloxanes, polyethers, and their co-polymers, and the agents can be used singly or in combination. Examples of siloxanes are straight silicone oils such as dimethyl silicone oil, methylphenyl silicone oil, methylhydrogen silicone oil, and the like, dimethyl polysiloxanes denatured with methylstyrene, long chain alkyl, polyether, carbinol, epoxy, carboxyl, mercapto, higher fatty acids, methacryl, and others. Perenol F40 and Perenol S43 made by Sun Nopuco Co., SC5570 made by Toray-Dow Corning Silicone Co., TSA 750 made by Toshiba Silicone Co., and the like. When using the mold release agent, the content of the mold release agent is desirably in the range of 1–5 parts by weight to 100 parts of the total weight of the previously described first to fourth resins.

The flame retardant is a component for contributing to retard combustion of the photosensitive resin composition, and substances known as the flame retardants, or the flame retarding assistant agents are usable. The flame retardants suitable for the present invention are, for instance, halides of epoxy, aromatic, aliphatic, and alicyclic compounds, red phosphorus or white phosphorus, phosphorus group compounds such as non-halogenized phosphoric ester, halogenized phosphoric ester, polyphosphate, polyphosphonate, polyol containing phosphorus, polyphosphoric acid, and the like, and antimony group flame retardants such as antimony trioxide, and the like. Furthermore, more than two kinds of the flame retardants selected arbitrary from the above retardants group can be used concurrently for utilizing their synergistic effects. When using the flame retardant, the content of the retardant is desirably in the range of 1–10 parts by weight to 100 parts of the total weight of the previously described first to fourth resins, particularly, the range of 3–10 parts is preferable. If the content of the flame retardant is excessively small, a sufficient flame retarding effect can not be obtained, and if the content is excessively large, the flame retardant gives undesirable effect to resolution, adhesiveness, and plating solution contamination.

As the sensitizer, any compound which operates for sensitizing the photo-acid generating agent can be used widely. For instance, the sensitizers which operate as the sensitizer for sulfonium salt are derivatives of perylene, anthracene, phenothiazine, and the like. The sensitizers which operate as the sensitizer for iodonium salt are dyes such as acridine orange, acridine yellow, benzoflavine, phosphine R, cetoflavine T, and the like. SP 110 made by Asahi Denka Kogyo K.K. is available commercially. When using the sensitizer, the content of the sensitizer is desirably in the range of 0.1–5 parts by weight to 100 parts of the total weight of the previously described first to fourth resins.

The inorganic compound particles have an effect to increase the tack free property of the photosensitive film, and to improve a surface roughening efficiency of the plated film of the resin composition material after curing, and hydroxides, oxides, or carbonates of the elements in IIa group, IIIa group, or IVa group can be used. Any one kind of these materials can be used, or more than two kinds selected from these materials can be used concurrently. The inorganic compound particles usable for the present invention are, for instance, calcium carbonate, magnesium carbonate, magnesium hydroxide, aluminum hydroxide, silicon oxide, and the like. The particle size of the inorganic compound is desirably smaller than the thickness of the insulating film to be formed and the diameter of the via-hole.

When using the inorganic compound particles, the content of the particles is desirably in the range of 3–50 parts by weight to 100 parts of the total weight of the previously described first to fourth resins. When the content is more than 3 parts by weight, a sufficient effect for improving the adhesiveness can be obtained, but if more than 50 parts by weight, the developing property may be spoiled.

The leveling agent is an additive to improve flatness of the photosensitive film after forming the film (printing), and a co-polymer of acrylic acid ester group can be used. The commercially available leveling agent is, for instance, Modaflow made by Mont Santo Co. When using the leveling agent, the content of the agent is desirably in the range of 0.5–10 parts by weight to 100 parts of the total weight of the previously described first to fourth resins.

The photosensitive resin composition of the present invention can contain arbitrarily a solvent. That is, a photosensitive resin varnish obtained by dissolving or dispersing the components selected from the previously described respective components into a solvent is also preferable as the photosensitive resin composition of the present invention.

For the resin composition of the present invention, the following solvents are usable: aromatic hydrocarbons such as toluene, xylene, and the like, alcohol such as methanol, ethanol, and the like, esters such as ethyl acetate, butyl acetate, and the like, ketones such as methylethylketone, tetrahydrofuran, and the like, glycol ethers such as ethyleneglycol monomethylether, ethyleneglycol monoethylether, and the like, glycol derivatives such as methyl cellosolve acetate, ethyl cellosolve acetate, propyleneglycol monomethyl ether acetate, diethyleneglycol monomethyl ether acetate, and the like, alicyclic hydrocarbon such as cyclohexanone, cyclohexanol, and the like, and petroleum group solvent such as petroleum ether, petroleum naphtha, and the like.

The solid concentration of the photosensitive resin composition of the present invention in the varnish can be determined arbitrary depending the method for forming the film, the film thickness after forming the film, and others. However, generally, a content in the range of 30–80% by weight is desirable, because a film of which film thickness is in the range of 20–100 $\mu$m can be formed by only one application.

BRIEF DESCRIPTION OF THE DRAWINGS

These and other objects, features and advantages of the present invention will be understood more clearly from the following detailed description with reference to the accompanying drawings, wherein.

Figure 1:
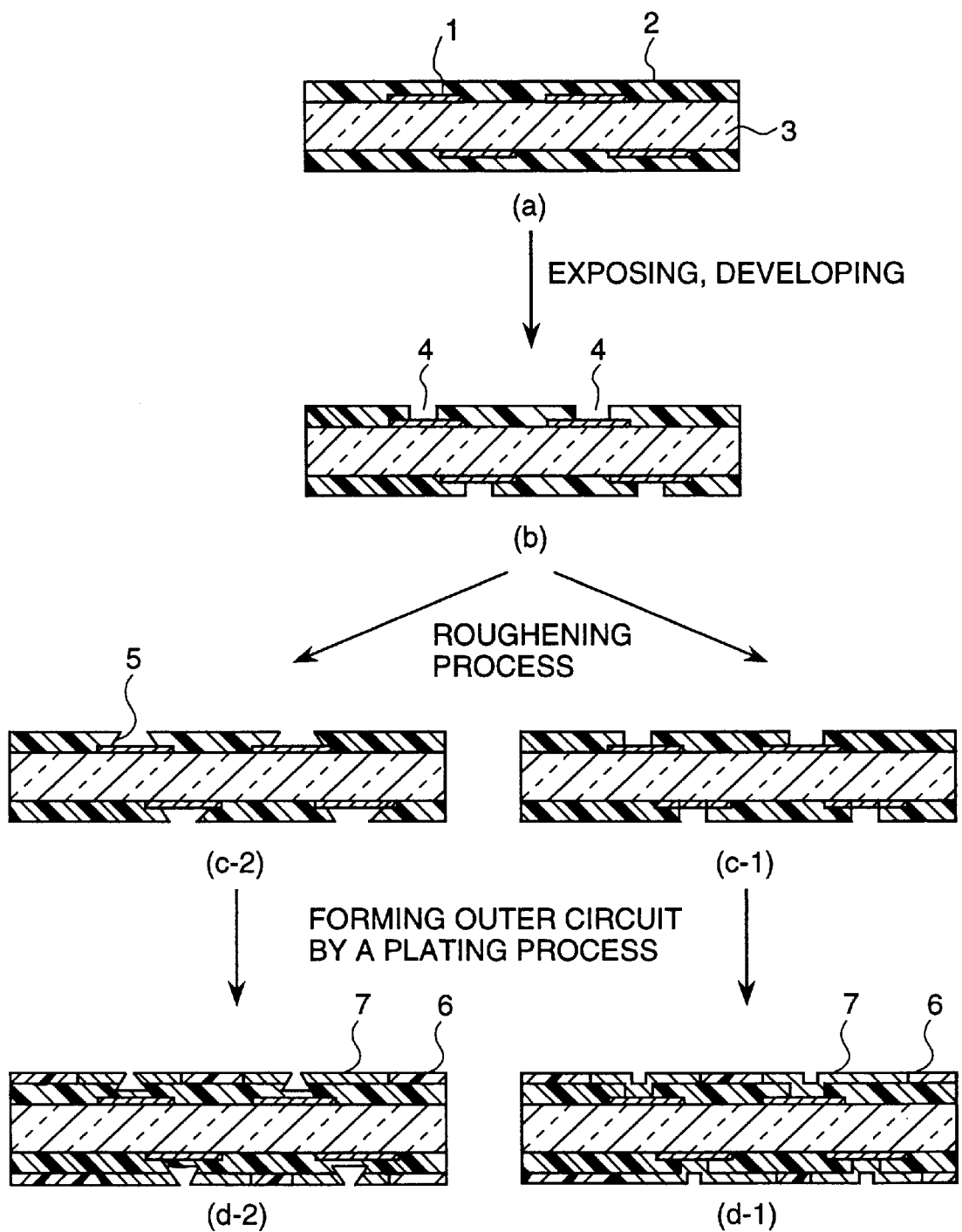
FIG. 1 is a schematic illustration indicating a process for forming an insulating layer and a circuit layer using the conventional photosensitive resin composition.

DESCRIPTION OF THE PREFERRED EMBODIMENTS (Embodiments 1–9)

Varnishes, of which solid concentration was 60% by weight, were prepared by dissolving or dispersing respective of the components indicated in Table 1 into 1-acetoxy-2-ethoxyethane, and their performance was evaluated by performing the following tests (1) to (7). The results of the tests were all preferable as shown in Table 1. That is, in all the embodiments from 1 to 9, a resin film having a preferable adhesiveness, no peeling around the through holes for forming via-holes, and a desirable characteristics could be obtained. The resin films had a high resolution, a high glass transition point, and a characteristics suitable for the insulating film of the multilayer circuit board.

TABLE 1

| | Embodiments | | | | | |
|---|---|---|---|---|---|---|
| | 1 | 2 | 3 | 4 | 5 | 6 |
| Ep-828[*1] | 5.6 | 5 | 5 | 5 | 5 | 5 |
| ESCN-195[*1] | — | — | — | — | 45 | — |
| BREN-105[*1] | — | — | — | — | — | 45 |
| KRM-2650[*1] | 50 | 45 | 45 | 45 | — | — |
| CNA105[*1] | 44.4 | 40 | 40 | 40 | 40 | 40 |
| HP-180R[*1] | — | 10 | 10 | 10 | 10 | 10 |
| UV1-6974[*2] | 3 | 3 | 3 | 3 | 3 | 3 |
| XER91P[*2] | — | — | — | — | — | — |
| DT-8208[*2] | — | — | 10 | 10 | 10 | 10 |
| R5259[*2] | — | — | — | — | — | — |
| CP66[*2] | — | — | 3 | 3 | 3 | 3 |
| SP100[*2] | — | — | — | 0.3 | 0.3 | 0.3 |
| S43[*2] | — | — | 1 | 1 | 1 | 1 |
| Silicon oxide[*2] | — | — | 13 | 13 | 13 | 13 |
| Film thickness (μm) | 52 | 52 | 55 | 53 | 55 | 55 |
| Tack-free property | ○ | ○ | ○ | ○ | ○ | ○ |
| Resolution (μm) | 25 | 25 | 40 | 40 | 40 | 40 |
| Tg (° C.) | 190 | 220 | 210 | 210 | 205 | 215 |
| Adhesiveness[*3] | 0.7 | 0.7 | 0.9 | 0.9 | 1.0 | 0.8 |
| Adhesiveness[*4] | 0.8 | 0.9 | 1.0 | 1.1 | 1.2 | 1.2 |
| Peeling[*5] | ○ | ○ | ○ | ○ | ○ | ○ |

| | Embodiments | | | Comparative examples | | |
|---|---|---|---|---|---|---|
| | 7 | 8 | 9 | 1 | 2 | 3 |
| Ep-828[*1] | 6.3 | 10 | 5 | 8.3 | 8.3 | 8.3 |
| ESCN-195[*1] | — | — | — | — | — | — |
| BREN-105[*1] | — | — | — | — | — | — |
| KRM-2650[*1] | 56.22 | 40 | 45 | 75 | 75 | 75 |
| CNA105[*1] | 5 | 40 | 40 | — | — | — |
| HP-180R[*1] | 12.5 | 10 | 10 | 16.7 | 16.7 | 16.7 |
| UV1-6974[*2] | 3.8 | 3 | 3 | 5 | 5 | 5 |
| XER91P[*2] | — | — | 5 | — | — | — |
| DT-8208[*2] | 12.5 | 10 | 10 | 16.76 | 16.76 | 16.76 |
| R5259[*2] | 25 | — | — | 6.7 | 6.7 | 6.75 |
| CP66[*2] | 3.8 | 3 | 3 | 5 | 5 | — |
| SP100[*2] | 0.4 | 0.3 | 0.3 | — | — | 0.5 |
| S43[*2] | 1.3 | 1 | 1 | 1.7 | 1.7 | 1.7 |
| Silicon oxide[*2] | 16.3 | 13 | 13 | 21.75 | 21.75 | 21.75 |
| Film thickness (μm) | 53 | 55 | 53 | 3 | 3 | 3 |
| Tack-free property | ○ | ○ | ○ | ○ | ○ | ○ |
| Resolution (μm) | 40 | 40 | 40 | 40 | 40 | 40 |
| Tg (° C.) | 218 | 210 | 220 | 210 | 210 | 210 |
| Adhesiveness[*3] | 0.9 | 0.9 | 0.9 | 0.9 | 0.9 | 0.9 |
| Adhesiveness[*4] | 1.4 | 1.4 | 1.4 | 1.4 | 0.3 | 0.3 |
| Peeling[*5] | ○ | ○ | ○ | × | ○ | ○ |

Remarks:
[*1]Parts
[*2]parts to 100 parts of total weight of the above compounds marked with [*1]
[*3]Adhesiveness of inner layer circuit
[*4]Adhesiveness of plated circuit
[*5]Peeling at bottom of via-hole The first resin is composed of a multifunctional epoxy resin, "Ep-828" is a bisphenol A epoxy resin (189 g/equivalent) made by Yuka-Shell Co., "ESCN-195" is a cresol novolak type epoxy resin (198 g/equivalent) made by Sumitomo Chemical Co., "BREN-105" is a bromide novolak type epoxy resin (270 g/equivalent) made by Nippon Kayaku Co., and "KRM-2650" is a cresol novolak type epoxy resin (220 g/equivalent) made by Asahi Denka Kogyo K.K. The second resin having a N-substituted carbamic acid ester atomic group and a radical polymeric unsaturated bond is such as "CNA105", which is epoxy acrylate added with acrylisocyanate (acrylisocyanate added rate is 2%), made by Nippon Kayaku Co., and the third resin having a phenolic hydroxyl group is such as "HP-180R", which is resol resin, made by Hitachi Chemical Co.

"UVI-6974" is triphenylsulfonium hexafluoroantimonate (photo-acid generator) made by Union Carbide Co., "XER91P" is rubber fine particles made by Japan Synthetic Rubber Co., "DT-8208" is epoxy denatured rubber made by Daito Sangyo Co., "R5259" (radical polymeric resin) is epoxy acrylate added with acid anhydride (acid value 72 mg KOH/mg) made by Nippon Kayaku Co., "CP-66" is 2-butenyl tetramethylene-sulfonium hexafluoroantimonate (thermal curing agent) made by Asahi Denka Kogyo K.K., "SP100" is a sensitizer for UVI-6974 made by Asahi Denka Kogyo K.K., "S43" is Perenol S43, which is a polysiloxane co-polymer (mold release agent) made by Sun Nobuco Co., and silicon oxide fine particles used had an average particle size of 1 μm.

(1) Evaluation of Resolution (Developing Property)

A sample having a photosensitive layer by applying a photosensitive varnish onto copper surface of a metal foil having a double structure of aluminum and copper (UTC foil made by Mitsui Mining & Smelting Co., thickness: 50 μm), and drying the applied varnish at room temperature for one hour and at 120° C. for 15 minutes. The sample was irradiated with ultraviolet rays of 2.5 J/cm$^2$ by an extra-high pressure mercury lamp via a via-hole mask having diameters in the range of 10–160 μm. Then, after curing of the photosensitive layer was enhanced by heating at 120° C. for 15 minutes, the photosensitive layer was developed by spraying a developing solution (an aqueous solution containing 2,2-butoxyethoxyethanol 400 ml/L, and sodium hydroxide 10 g/L) onto the layer.

The resolution was determined as the minimum diameter of the via-hole which could be developed (that means, the smallest inner diameter of the obtained through holes).

(2) Evaluation of the Tack-Free Property

If the photosensitive layer was adhered to the via-hole mask when the via-hole mask was peeled off from the exposed sample during the above resolution test, the sample was determined as undesirable in the tack-free property, and the sample which did not adhere to the mask was determined as desirable. In Table 1, undesirable tack-free property was expressed by X, and desirable tack-free property was expressed by ○.

(3) Determination of Film Thickness

The developed sample obtained by the above test for (1) evaluation of the resolution was cured by heating at 180° C. for two hours. Then, the cured film after the curing was separated from the foil by the steps of etching the aluminum layer with an aqueous solution of sodium hydroxide (100 g/L), washing, and etching again the copper layer with an etching solution composed of a mixture of sulfuric acid (100 g/L) and 35% aqueous solution of hydrogen peroxide (200 g/L); and thickness of -the film was measured.

(4) Determination of Glass Transition Temperature

A sample was prepared by cutting the cured film used in the determination of the film thickness in a rectangular shape of 30 mm×5 mm, and the glass transition temperature was determined by measuring a dynamic viscoelasticity using an instrument made by I.T. Measurement and Control Co. The conditions of the measurement were; the distance between supporting points: 20 mm, measuring frequency: 10 Hz, temperature elevating velocity: 5° C./minute, and measuring temperature range: room temperature −300° C.

(5) Determination of the Adhesion Force With Inner Layer Circuit

After surface of a copper foil of 20 μm thick was roughened with an aqueous solution of ammonium persulfate, an oxide layer was formed by an aqueous solution containing sodium perchlorate as a main component. The oxide layer was treated for reduction with an aqueous solution of dimethylamine borane, and dried. A photosensitive varnish was applied onto the surface of the obtained roughened surface, dried, exposed by the total surface as same as the above test of (1) evaluation of the resolution, and cured by heating at 180° C. for 2 hours. Subsequently, the resin film was adhered to a glass epoxy substrate by applying an epoxy adhesive agent (Araldite made by Nagase-Chiba Co.) onto the surface of the resin film. The peeling strength of the copper foil was measured by a method defined in the JIS C6481.

(6) Determination of the Adhesion Force With Plated Circuit

A copper plated laminated plate having a copper foil of 18 μm thick was treated as same as the above test (5) by the steps of; treating the surface of the copper foil, applying a photosensitive varnish, exposing to form a resin film, enhancing the curing by heating at 140° C. for 30 minutes, roughening the surface with an aqueous solution of permanganic acid, treating for neutralizing, adding plating catalyst, and treating for activation. However, only the comparative example 2 was heated at 180° C. for 60 minutes for enhancing the curing. Then, after a copper layer was formed onto surface of the activated resin film by chemical plating, a panel plated copper layer of approximately 20 μm thick was formed by electric plating. The layer was further heated at 180° C. for 2 hours, and then, the peeling strength of the plated copper layer was measured by the method defined in the JIS C6481.

(7) Confirmation of Absence of Via-Hole Peeling After Roughening Treatment

A copper plated laminated plate having a copper foil of 18 μm thick was treated as same as the above test (5) by the steps of; treating the surface of the copper foil, applying a photosensitive varnish, exposing via a via-hole mask as same as the above test (1) to form a through hole, which reaches at the copper foil of the lower layer through the resin film, enhancing the curing by heating, and subsequently roughening the surface as same as the above (5). Then an observation around the through hole was performed. However, if a same roughening condition was used, the results varied somewhat depending on the diameter of the via-holes. Therefore, the observation was performed on the via-hole of 50 μm in diameter in all the embodiments and the comparative examples. The case when any peeling was not observed at the bottom portion of the hole through the resin film is expressed with ○ in Table 1, and the case when any peeling was generated and whitening was observed at the bottom portion of the through hole is expressed with × in Table 1, respectively.

(Comparative Examples 1–3)

In accordance with the comparative example 1, a photosensitive resin composition, which did not contain the resin (CNA105) having a N-substituted carbamic acid ester atomic group and a radical polymeric unsaturated bond in its side chain, was used in forming the resin film by the same method as the embodiments 1–9. However, peeling were generated at the bottom portion of the hole through the resin film, and it formed a reverse tapered shape.

The film in the comparative example 2 was formed by the same method as the comparative example 1, except the curing before the roughening was enhanced by heating at 180° C. for 2 hours. In accordance with the comparative example 2, the peeling at the bottom portion of the hole through the film was not generated in the roughening treatment because of the effect of the thermal curing agent. However, the roughening the surface of the resin film could not be performed sufficiently, and the film was not suitable for practical use because the adhesiveness of the resin film with the plated copper layer was weak.

The film in the comparative example 3 was formed by the same method as the comparative example 1, except the sensitizer was added to the photosensitive varnish. In accordance with the comparative example 3, the peeling at the bottom portion of the hole through the film was not generated in the roughening treatment as well as the comparative example 2. However, the roughening the surface of the resin film could not be performed sufficiently, and the film was not suitable for practical use because the adhesiveness of the resin film with the plated copper layer was weak.

(Embodiment 10)

An inner circuit substrate was prepared by an etching treatment of a glass epoxy substrate having a copper layer of 18 μm thick. Surface of the inner layer circuit substrate was roughened with an aqueous solution of ammonium persulfate, and an oxide film was formed with an aqueous solution of sodium perchlorate. Then, the oxide layer was treated for reduction with an aqueous solution of dimethylamine borane, and dried. Subsequently, a photosensitive layer was formed by applying the photosensitive varnish of the embodiment 4 onto the treated inner circuit surface by screen printing, and dried. The thickness of the photosensitive layer was approximately 50 μm.

Then, the insulating film provided with a through hole for forming via-hole, which reached at the circuit in the lower layer through the insulating film, at a designated portion was obtained by irradiating (2.5 J/cm$^2$) the designated position via a via-hole mask, and heating at 140° C. for 30 minutes as same as the embodiments 1–9.

After polishing the surface of the obtained insulating film mechanically, the inner wall of the through hole for forming the via-hole and the surface of the insulating film were roughened with an aqueous solution of permanganic acid. Subsequently, after neutralizing and adding plating catalyst, a pattern was formed by laminating etching resists. Then, the plating catalyst was activated, and the via-hole and fine circuit of second layer were formed by precipitating conductors on the activated surface by chemical plating. After drying, post curing was performed at 180° C. for 2 hours.

Figure 2:
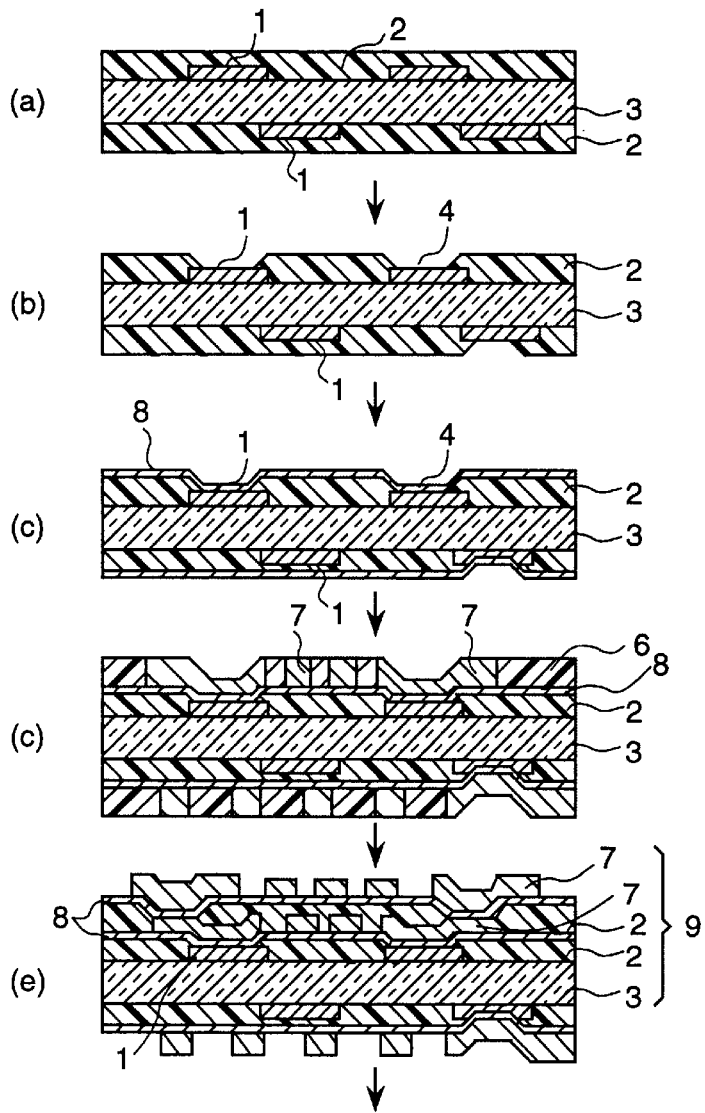
FIG. 2 is a schematic illustration indicating a process for manufacturing a multilayer circuit board of the present invention.
Figure 3:
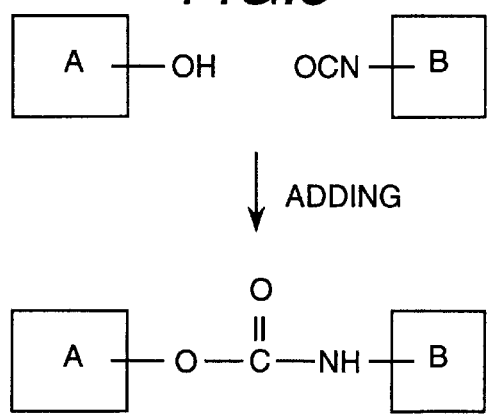
FIG. 3 is a schematic illustration for indicating a method for introducing N-substituted carbamic acid ester group into a side chain of the resin.

Furthermore, a multilayer circuit board 9 as shown in FIG. 2(*e*) was obtained by forming multilayer by repeating the respective processes of the same photosensitive film formation, the surface treatment, and the conductor formation. The obtained substrate 9 was immersed and kept for 10 minutes in a 200° C. soldering reflow vessel and for one minute in a 288° C. soldering vessel, but any peeling was not observed on the conductor circuit nor between the photosensitive layers.

As the result of the present embodiment, it was confirmed that the heat resistant photosensitive resin composition of the present embodiment can be developed with a non-flammable aqueous developing solution, and had a high tack-free property without lowering its resolution, and a high adhesiveness to conductor circuit with suppressing a decrease of the glass transition point. In accordance with the present embodiment, a high density multilayer circuit board having a preferable heat resistance was obtained by using the photosensitive resin composition having a preferable characteristics.

(Embodiment 11–16)

An inner circuit substrate was prepared using a glass epoxy substrate having a copper layer of 18 μm thick by the steps of roughening surface of the copper layer with an aqueous solution of ammonium persulfate, forming an oxide film with an aqueous solution containing sodium perchlorate as a main component, performing a reduction treatment with an aqueous solution of dimethylamine borane, and drying. Subsequently, a photosensitive varnish, which had a solid concentration of 70% by weight and was obtained by dissolving-dispersing each of the components shown in Table 2 into diethylene glycol monomethylether acetate, was applied onto the substrate by screen printing, and dried.

Then, in order to form via-holes of various sizes, the substrate was irradiated (2.7 J/cm$^2$) with an extra-high pressure mercury lamp at a designated position via a via-hole mask, and heated at 120° C. for 15 minutes for enhancing its curing. The thickness of the obtained resin film was determined. The results are shown in Table 2.

Subsequently, the film was developed by s spray development with a semi-aqueous developing solution (2,2-butoxyethoxyethanol 400 ml/L. sodium hydroxide 10 g/L). The diameter of the via-hole which could be developed at the time (that is, the inner diameter of the smallest hole among the obtained through holes) was taken as the resolution.

Then, the substrate provided with through holes for forming via-holes having an insulating film was prepared by the steps of; enhancing the curing by heating at 150° C. for one hour, roughening the surface with an aqueous solution of permanganic acid, treating for neutralizing, adding plating catalyst, treating for activation, plating a panel plating of approximately 20 μm thick by concurrently using chemical plating and electric plating as same as the embodiments 1–9, and heating at 180° C. for 2 hours.

The through hole portion (diameter 100 μm) of the obtained substrate was cut by a low speed cutter, and the cross section was polished, observed, and evaluated. The results are also shown in Table 2. In Table 2, the via-hole shape is expressed by "○" only when no reverse tapered portion inside the via-hole was observed in any of the 100 samples (cross sections of through holes) and an uniform plated film was formed, by "Δ" when, although the reverse tapered portion inside the via-hole was observed somewhat, the plated film was formed uniformly and the substrate is practically usable, and by "×" when the reverse tapered portion inside the via-hole was generated and the plated film was formed unevenly.

The adhesive force with the plated circuit and the soldering heat resistance shown in Table 2 were measured in accordance the method defined in the JIS C6481. The soldering heat resistance was measured at 260° C.

TABLE 2

| | Embodiments | | | | | |
|---|---|---|---|---|---|---|
| | 11 | 12 | 13 | 14 | 15 | 16 |
| KRM 2650*[1] | 45 | 45 | 45 | 45 | 45 | 45 |
| Ep-828*[1] | 5 | 5 | 5 | 5 | 5 | 5 |
| CNA117*[1] | 30 | 30 | 30 | 30 | 30 | 30 |
| SP-70*[1] | 3 | 3 | 3 | 3 | 3 | 3 |
| R.P.I.*[2] | I-184 | I-184 | I-184 | I-651 | I-1173 | DETX-S |
| ( )*[1] | (0.1) | (0.5) | (1.0) | (0.5) | (0.5) | (0.5) |
| HP180R*[1] | 10 | 10 | 10 | 10 | 10 | 10 |
| DT8208*[1] | 15 | 15 | 15 | 15 | 15 | 15 |
| CP66*[1] | 3 | 3 | 3 | 3 | 3 | 3 |
| SP100*[1] | 0.3 | 0.3 | 0.3 | 0.3 | 0.3 | 0.3 |
| R5259*[1] | 10 | 10 | 10 | 10 | 10 | 10 |
| SiO$_2$*[1] | 15 | 15 | 15 | 15 | 15 | 15 |
| Film thickness*[3] | 53 | 59 | 59 | 57 | 58 | 58 |
| Resolution*[3] | 60 | 70 | 80 | 70 | 80 | 90 |
| Via-hole shape | Δ | ○ | ○ | ○ | ○ | Δ |
| Adhesive force*[4] | 1.20 | 0.95 | 1.05 | 1.00 | 1.10 | 0.90 |
| Sol. heat resist*[5] | >60 | >60 | >60 | >60 | >60 | 40 |

*[1]/parts by weight
*[2]Radical polymerization initiator
*[3]/μm
*[4]Adhesive force with plated circuit/kgf/cm
*[5]Soldering heat resistance/second In accordance with the above results, the photosensitive resin composition used in the embodiments 11–16, and the multilayer circuit board obtained by the same were confirmed to be preferable products having a high connection reliability. Furthermore, the heat resistance expressed by the soldering heat resistance was confirmed to be improved by increasing the internal curing property.

Particularly, in accordance with the embodiments 12–15, wherein the self cleavage type radical polymerization initiator was used, the through holes having a remarkably preferable shape (that is, no reverse tapered dimple) could be formed. The embodiment 11 revealed that, even if the amount of the photoradical polymerization initiator is small, an improvement in the via-hole shape and the soldering heat resistance was observed.

In Table 2, "CNA-117" is epoxyacrylate added with acryl isocyanurate (acrylisocyanate adding rate 2%) made by Nippon Kayaku Co., and "HP-180R" is a resol resin made by Hitachi Chemical Co. "SP-70" is triphenylsulfonium hexafluoroantimonate (photo-acid generator) made by Asahi Denka Kogyo K.K., "I-184" is 1-hydroxycyclohexyl phenylketone (self-cleavage type radical polymerization initiator) made by Chiba-Geigy Co., "I-651" is benzyldimethylketal (self-cleavage type radical polymerization initiator) made by Chiba-Geigy Co., "I-1173" is 2-hydroxy- 2-methyl-1-phenylpropane-1-on (self-cleavage type radical polymerization initiator) made by Chiba-Geigy Co., and "DETX-S" is Kayacure DETX-S made by Nippon Kayaku Co., that is, 2,4-diethylthioxanthone (hydrogen withdrawal type polymerization initiator). In the present embodiment, silicon oxide particles having an average diameter of 1 μm was used as well as the embodiments 1–9.

(Embodiment 17)

The method for manufacturing the multilayer circuit boards using the photosensitive resin composition of the present invention described in the embodiments 1–17 is explained hereinafter referring to FIG. 2. The multilayer circuit board can be manufactured by the following four steps (1)–(4).

(1) Process for Forming a Photosensitive Film

Photosensitive film is formed on surface of a substrate 3 having an inner layer circuit 1 using the photosensitive resin composition of the present invention so as to cover the circuit (FIG. 2($a$)). As the substrate 3 having an inner layer circuit, i.e. a starting material, either of substrates, which is manufactured by etching a copper plated laminated plate, and by forming the circuit by an additive method on a laminated plate can be used. When copper is used for forming the conductor circuit 1, the adhesive force of the conductor circuit 1 with the photosensitive film 2 (and the resin composition material after curing, that is, the insulating film) can be increased by conventional roughening of the copper surface, forming an oxide layer, reducing the oxide layer, nickel plating, and others.

Any one of the methods for forming film such as dip coating, curtain coating, roll coating, knife coating, screen printing, and others can be used. When using the above applying method, the solvent is desirably removed after applying the composition onto the surface of the substrate by heating at a temperature, which does not cure epoxy resin (generally 80–120° C., in order to make the film tack-free. Or, the composition is previously formed in a shape of self supporting film, and the film can be formed by adhering the self supporting film.

(2) Exposure Process and Developing Process

Next, the film is exposed with light via a via-hole mask (not shown in the figure). After removing the unexposed portion by dissolving into a developing solution so as to form a through hole 4 for forming via-hole reaching at a circuit in the lower layer through the insulating film 2, the film is heated at a designated temperature (FIG. 2($b$)).

The photosensitive resin composition of the present invention can be developed with an aqueous developing solution, which is superior in safety and environmental sanitation. The aqueous developing solution suitable for the present invention is such as an aqueous solution of water-soluble organic solvent having a high boiling temperature, an aqueous solution of water-soluble organic solvent having a high boiling temperature added with an alkaline component, and the like. As the water soluble organic solvent, 2-butoxyethanol, 2,2-butoxyethoxy ethanol, and the like, are adequate. As the alkaline component, sodium hydroxide, potassium hydroxide, tetramethylammonium hydroxide, borax, and the like are usable. The concentration of the water soluble organic solvent is desirably in the range of approximately 10–80% by weight, which is a non-combustible range, and the concentration of the alkaline component is desirably in the range of 1–20% by weight.

(3) Surface Treating Process

Then, roughening the surface of the insulating film 2 (including inner surface of the through hole 4), removing the residual of the roughening, adding plating catalyst 8, and activating the surface of the insulating film 2 are performed (FIG. 2($c$)). The roughening process can be performed with a chromic acid mixture, an aqueous solution of permanganic acid, and the like.

(4) Circuit Forming Process

Then, conductor circuits of a designated pattern and via-holes are formed on the surface of the insulating film 2 (including inner surface of the through hole 4) (FIG. 2($d$)) by the steps of; covering the surface of the insulating film 2 added with the plating catalyst 5 with plating resist 6, exposing by light via a mask (not shown in the figure) having a designated pattern, developing, curing the resist 6 by heating under a designated condition, forming fine conductor circuits by chemical plating of concurrent use of chemical plating and electric plating, and peeling the plated resist 6. If the curing by heating after the development is insufficient, post curing by heating at least 160° C. can be performed after forming the conductor circuit 7, in order to enhance the curing the insulating film 2.

In forming the conductor circuit layer 7 (flat circuit and via-hole circuit), there are two methods such as a full additive method which uses only chemical plating, and a semiadditive method which uses both chemical plating and electric plating concurrently. In the present invention, either of the two methods is usable. In view of making the circuit finer, the former method is more effective in comparison with the latter. However, many resins among conventional photosensitive epoxy resin can not be used in the former method, because the plating solution is highly alkaline and one of the conditions for the plating is at a high temperature. Since the photosensitive resin of the present invention has a superior plating solution resistance, the resin can be used effectively in forming the circuit by the full additive method.

In accordance with the method explained above, the insulating layer, circuit for interlayer connection, and the flat circuit of the first layer are formed. The multilayer circuit board 9 of the present invention can be obtained by increasing the number of the layer (FIG. 2($e$)) by repeating the process of (1)–(4) adequately. When the photosensitive resin composition of the present invention is used in forming the photosensitive film 2 in the process (1), peeling or floating of the photosensitive film 2 (and the insulating film after curing) in the vicinity of the through hole 4 from the inner circuit 1 can be avoided, and forming the reverse tapered shape can also be avoided, even after the roughening and adding the plating catalyst are performed (in a condition after the process (3)). Since the photosensitive resin composition of the present invention is superior in curing inside the layer, the heat resistance of the resin has been improved significantly. Furthermore, the photosensitive resin composition of the present invention is superior in developing property, plating solution resistance, and the like. Therefore, the photosensitive resin composition of the present invention is useful in forming interposer substrates and multi-chip module substrate.

The multilayer circuit board using the photosensitive resin composition of the present invention has a high adhesiveness between the conductor circuit and the insulating film 2 at a high temperature. In accordance with the present invention, separation of the conductor circuit by a thermal stress generated during the solder reflow process, the repairing process, and the like can be prevented, because the insulating film 2 fixes the conductor circuit in the multilayer circuit board. Therefore, a high density multilayer circuit board having a high reliability can be obtained by the present invention.

Particularly, use of the photosensitive resin composition containing the rubber component, the inorganic filler, or the thermosetting agent is preferable. Because, a high adhesiveness of the film with the inner circuit can be obtained by decreasing the elastic modulus of the film with the effect of the rubber component, and a high adhesiveness of the film with the conductor circuit, which is formed by plating, can be obtained by improving the surface roughening efficiency with the effect of the inorganic filler.

The photosensitive resin composition of the present invention is, particularly, suitable for the multilayer printed circuit board, because an insulating film having a high hardness can be obtained. However, the uses of the photosensitive resin composition of the present invention is not restricted to the above multilayer printed circuit board, but is applicable to the interlayer insulating film of thin film multilayer circuit board, solder resist, or surface passivation film or α-ray shielding film of semiconductor devices.

(Embodiment 18)

Figure 4:
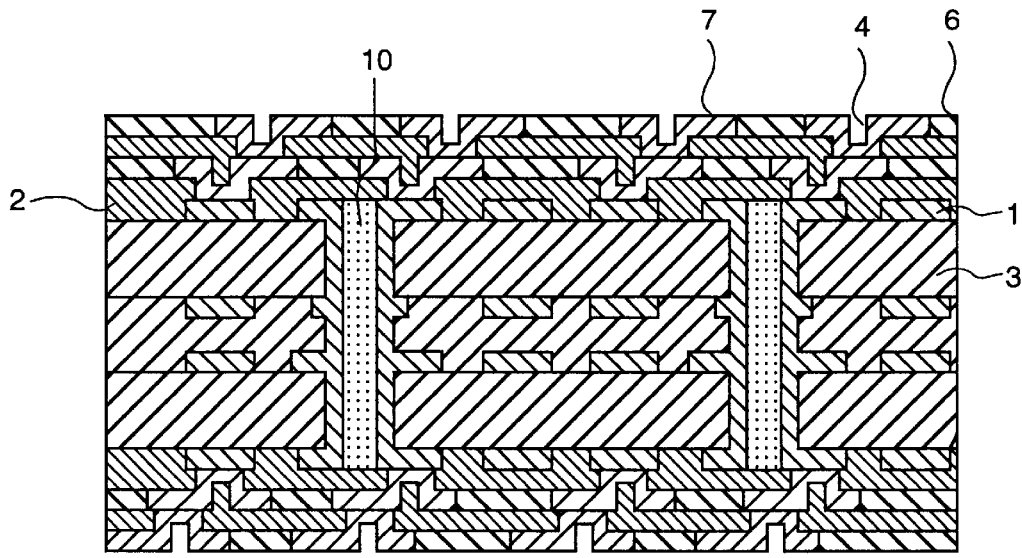
FIG. 4 is a schematic cross section indicating an example of multilayer circuit board using the photosensitive resin composition of the present invention.

An example of multilayer printed circuit board is indicated as a schema-tic cross section in FIG. 4; wherein the photosensitive resin composition of the embodiments 1–17 are used, and two circuit layers 11 are formed by a build up method on each of both sides of the core substrate 3 having four layers 1 of inner layer circuit.

The present embodiment is an example of multilayer circuit board, wherein the multilayer has been formed by the same method as the embodiment 17 using the core substrate 3 having four layers of inner layer circuit, which has been manufactured by a pre-determined method, as a starting material. The core substrate 3 in the present embodiment is an insulating layer made by the steps of; impregnating thermosetting resin into a glass cloth to form a pre-preg, applying varnish onto the pre-preg, and adhered three layers of the pre-preg to form the core substrate 3. Content of the glass cloth in the insulating layer is desirably 20–40% by volume, the specific dielectric constant is desirably in the range of 3.0–4.0, and the thermal expansion coefficient is desirably in the range of $5.0$–$8.0 \times 10^{-5}/°$ C. The core substrate 3 is desirably composed of 2–4 layers. The through hole 10 is filled with an insulating resin, or a conductor composed of a mixture of the insulating resin and metallic powder, after forming a conductor on the inner circumferential surface of the wall of the through hole by chemical copper plating. The thickness of one layer of the core substrate 3 is in the range of 300–400 μm, and the thickness of the inner circuit 1 is in the range of 10–30 μm.

In the above embodiments 1–17, the thickness of the photosensitive layer 2 was 50 μm. However, the thickness of the photosensitive layer is desirably in the range of 25–100 μm, and preferably 25–50 μm. The diameter of the via-hole 4 is desirably as same as the size of the thickness of the photosensitive layer 2, that is, desirably in the range of 25–100 μm, and preferably 25–50 μm.

(Embodiment 19)

Figure 5:
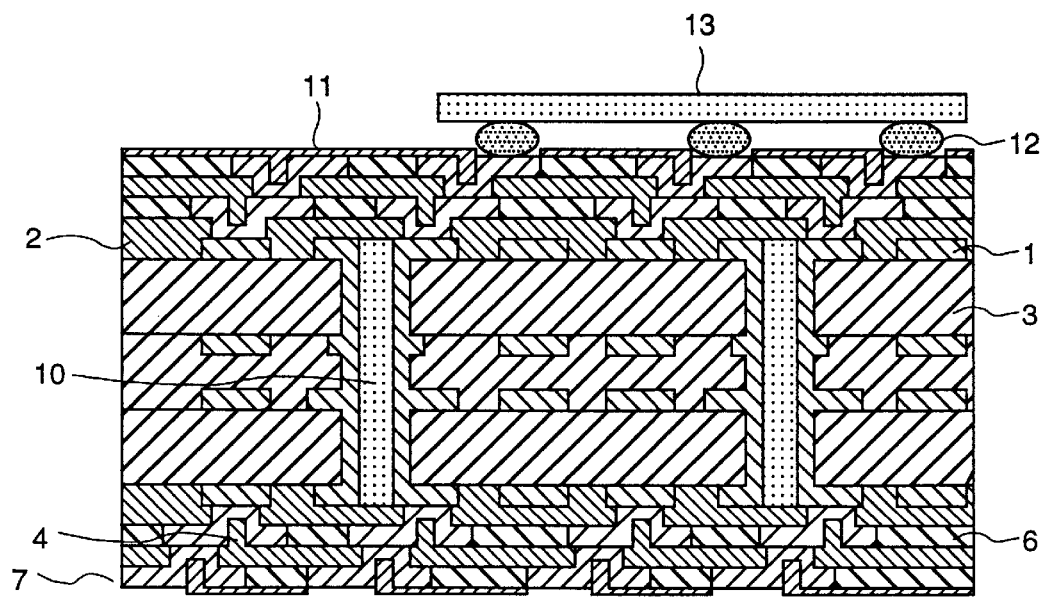
FIG. 5 is a schematic cross section indicating an example of mounting electronic devices onto the multilayer circuit board obtained by the embodiment 18.

FIG. 5 is a schematic cross section indicating an example of mounting LSI by a flip mounting using solder balls onto the multilayer printed circuit board, which has been obtained by the previous embodiment 18. In the present embodiment, the size was 10 cm rectangular in a flat shape.

The multilayer circuit board using the photosensitive resin composition of the present invention can be applied to various uses such as a mother board for electronic apparatus as personal computers, and the like, MCM (Multi-Chip-Module) board, interposer board, and the like.

Furthermore, various mounting methods of LSI such as CSP (Chip Size Package), BGA (Ball Grid Array), QFP (Quad Flat Pack package), and the like, in addition to the flip chip mounting method indicated in the present embodiment.

The multilayer printed circuit board of the present embodiment can be used as a memory module board, a disk board, and the like.

What is claimed is:

1. A photosensitive resin composition containing:

a first resin, said first resin being an epoxy resin, and a second resin having an N-substituted carbamic acid ester group and a radical polymeric unsaturated bond in its side chain, wherein said second resin is an epoxy resin, which further has a vinyl ester group in its side chain, said second resin being one of an oligomer expressed by the following general formula (chem. 1) and a halide of said oligomer:

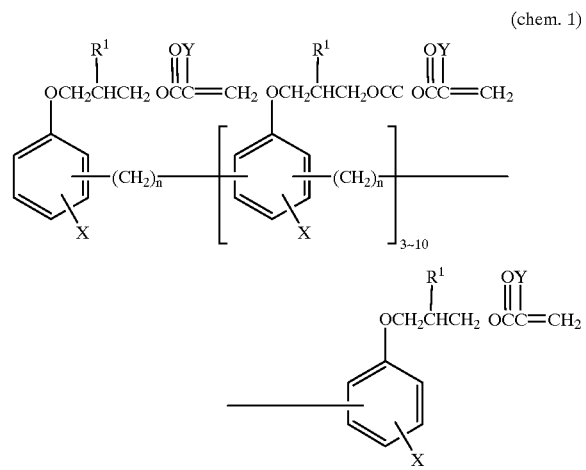

(chem. 1)

(where, X is hydrogen, or a methyl group, Y is hydrogen, or an alkyl group of carbon number 1–4, n is zero or 1, a part of $R^1$ contained in the molecule is an N-substituted carbamic acid ester group expressed by the following general formula (chem. 2), and the residual $R^1$ is a hydroxyl group),

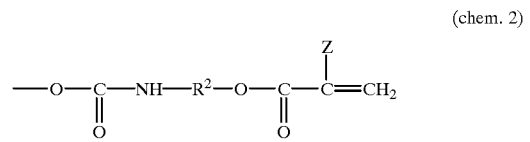

(chem. 2)

(where, $R^2$ is an alkylene group of carbon number 1–4, and Z is hydrogen, or an alkyl group of carbon number 1–4).

2. A photosensitive resin composition containing:

a first resin, said first resin being an epoxy resin, and a second resin having an N-substituted carbamic acid ester group and a radical polymeric unsaturated bond in its side chain, wherein said second resin is an epoxy resin, which further has a vinyl ester group in its side chain, said second resin being one of an oligomer expressed by the following general formula (chem. 3) and a halide of said oligomer:

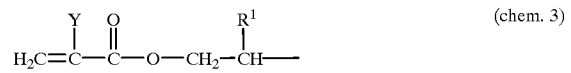

(chem. 3)

-continued

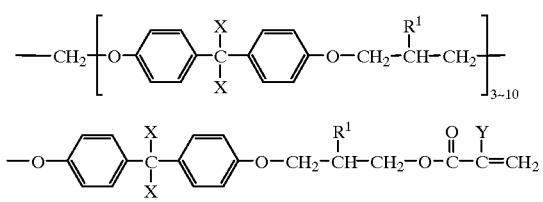

(where, X is hydrogen, or a methyl group, Y is hydrogen, or an alkyl group of carbon number 1–4, a part of $R^1$ contained in the molecule is an N-substituted carbamic acid ester atomic group expressed by the following general formula (chem. 2), and the residual $R^1$ is a hydroxyl group), (chem. 2)

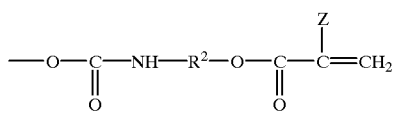

(where, $R^2$ is an alkylene group of carbon number 1–4, and Z is hydrogen, or an alkyl group of carbon number 1–4).

3. A photosensitive resin composition as claimed in either one of claims 1 and 2, wherein:
a weight ratio of said first resin to said second resin is in the range of 0.8:1–5:1.

4. A photosensitive resin composition as claimed in either one of claims 1 and 2, wherein:
the number of said N-substituted carbamic acid ester groups expressed by the general formula (chem. 2) is in the range of 0.5–20, taking the number of $R^1$ in a molecule of said second resin as 100.

5. A photosensitive resin composition as claimed in either one of claims 1 and 2, wherein:
said photosensitive resin composition further contains a photo-radical polymerization initiator.

6. A photosensitive resin composition as claimed in claim 5, wherein:
said photo-radical polymerization initiator is a self-cleavage polymerization initiator.

7. A photosensitive resin composition as claimed in claim 5, wherein:
the content of said photo-radical polymerization initiator is in the range of 0.1–5 parts by weight taking the total weight of said first resin and said second resin as 100 parts.

8. A photosensitive resin composition as claimed in either one of claims 1 and 2, wherein:
said first resin is a multifunctional epoxy resin.

9. A photosensitive resin composition as claimed in either one of claims 1 and 2, wherein
said first resin has an epoxy equivalent in the range of 100–500 g/equivalent.

10. A photosensitive resin composition as claimed in either one of claims 1 and 2,
wherein said photosensitive resin composition further contains a photo-acid generating agent.

11. A photosensitive resin composition as claimed in claim 10, wherein:
said photo-acid generating agent is an onium salt.

12. A photosensitive resin composition as claimed in claim 10, wherein:
the content of said photo-acid generating agent is in the range of 1–10 parts by weight taking the total weight of said first resin and said second resin as 100 parts.

13. A photosensitive resin composition as claimed in either one of claims 1 and 2,
wherein a rubber component is contained in said photosensitive resin composition.

14. A photosensitive resin composition as claimed in claim 13, wherein:
the content of said rubber component is in the range of 5–40 parts by weight taking the total weight of said first resin and said second resin as 100 parts.

15. A photosensitive resin composition as claimed in either one of claims 1 and 2, wherein:
said photosensitive resin composition is a material for forming an insulating film of a multilayer circuit board.

16. A photosensitive resin composition containing:
a first resin, said first resin being an epoxy resin, and
a second resin having an N-substituted carbamic acid ester group and a radical polymeric unsaturated bond in its side chain,
wherein said photosensitive resin composition further contains a third resin having a phenolic hydroxyl group.

17. A photosensitive resin composition as claimed in claim 16, wherein:
said third resin is a self-condensation resin.

18. A photosensitive resin composition as claimed in claim 16, wherein:
said third resin is at least one selected from the group consisting of novolak resin, resol resin, hydroxystyrene polymer, hydroxyphenylmaleimide polymer, and a co-polymer containing any one thereof.

19. A photosensitive resin composition as claimed in claim 16, wherein:
the content of said third resin is in the range of 5–30 parts by weight taking the total weight of said first resin and said second resin as 100 parts.

* * * * *